United States Patent
Kim (10) Patent No.: US 10,925,195 B2
(45) Date of Patent: Feb. 16, 2021

(54) OUTDOOR DISPLAY APPARATUS

(71) Applicant: SAMSUNG ELECTRONICS CO., LTD., Suwon-si (KR)

(72) Inventor: Sung Ki Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 125 days.

(21) Appl. No.: 15/829,102

(22) Filed: Dec. 1, 2017

(65) Prior Publication Data

US 2018/0160573 A1 Jun. 7, 2018

(30) Foreign Application Priority Data

Dec. 2, 2016 (KR) .................. 10-2016-0163760

(51) Int. Cl.
*H05K 7/20* (2006.01)
*G02F 1/1333* (2006.01)
(Continued)

(52) U.S. Cl.
CPC ... *H05K 7/20963* (2013.01); *G02F 1/133308* (2013.01); *G02F 1/133385* (2013.01);
(Continued)

(58) Field of Classification Search
CPC ......... G02F 1/133382; G02F 1/133308; G02F 1/133385; G02F 2001/133331;
(Continued)

(56) References Cited

U.S. PATENT DOCUMENTS 6,474,408 B1 * 11/2002 Yeh ..................... F28D 9/0043
 165/82
8,854,595 B2 * 10/2014 Dunn ................ G02F 1/133385
 349/161

(Continued)

FOREIGN PATENT DOCUMENTS

CN 105759497 A 7/2016
JP 2014163550 A * 9/2014

(Continued)

OTHER PUBLICATIONS

International Search Report (PCT/ISA/210), issued by International Searching Authority in corresponding International Application No. PCT/KR2017/012463 dated Feb. 21, 2018.
(Continued)

*Primary Examiner* — Hoan C Nguyen
(74) *Attorney, Agent, or Firm* — Sughrue Mion, PLLC (57) ABSTRACT

Disclosed herein is an outdoor display apparatus having a heat-radiating structure. The outdoor display apparatus includes a housing; a display module disposed inside the housing, and including a display panel on which an image is displayed; a heat-exchange module disposed on a rear surface of the display module, and configured to concentrate heat inside the housing on a rear surface of the display panel and discharge heat out of the housing; a protective glass disposed to correspond to a display area of the display panel, and configured to transmit infrared light; and a flow path formed inside the housing such that air flowing along the flow path transfers heat from the display panel to the heat-exchange module.

8 Claims, 10 Drawing Sheets

(51) Int. Cl.
*G09F 9/35* (2006.01)
*H05K 5/00* (2006.01)

(52) U.S. Cl.
CPC ............. *G09F 9/35* (2013.01); *H05K 5/0017* (2013.01); *H05K 7/20209* (2013.01); *G02F 2001/133331* (2013.01); *G02F 2203/11* (2013.01)

(58) Field of Classification Search
CPC ............ G02F 2203/11; H05K 7/20963; H05K 7/20209; H05K 5/0017; G09F 9/35
See application file for complete search history.

(56) References Cited

U.S. PATENT DOCUMENTS

| | | | |
|---|---|---|---|
| 2008/0165496 A1 | 7/2008 | Kang et al. | |
| 2009/0050298 A1* | 2/2009 | Takahashi | F28D 1/0435 165/104.19 |
| 2011/0051369 A1* | 3/2011 | Takahara | H05K 7/20972 361/696 |
| 2011/0085301 A1 | 4/2011 | Dunn | |
| 2012/0026432 A1 | 2/2012 | Dunn et al. | |
| 2013/0176517 A1* | 7/2013 | Kim | G02F 1/133385 349/58 |
| 2016/0198589 A1 | 7/2016 | Kang et al. | |
| 2016/0242330 A1* | 8/2016 | Dunn | H05K 7/20972 |

FOREIGN PATENT DOCUMENTS

| | | |
|---|---|---|
| KR | 100953213 B1 | 4/2010 |
| KR | 1020110016294 A | 2/2011 |
| WO | 2010080624 A2 | 7/2010 |

OTHER PUBLICATIONS

First Office Action dated Dec. 27, 2019 in the Chinese Patent Office in corresponding Chinese Application No. 201780072542.1.
Communication dated Jul. 6, 2020 from the Korean Patent Office in application No. 10-2016-0163760.
Communication dated Sep. 1, 2020 from the Intellectual Property Office of the P.R. China in application No. 201780072542.1.

* cited by examiner

OUTDOOR DISPLAY APPARATUS

CROSS-REFERENCE TO RELATED APPLICATION

This application claims the benefit of Korean Patent Application No. 10-2016-0163760, filed on Dec. 2, 2016 in the Korean Intellectual Property Office, the disclosure of which is incorporated herein by reference in its entirety.

BACKGROUND

1. Field

Apparatuses and methods consistent with exemplary embodiments relate to an outdoor display apparatus, and more particularly, to an outdoor display apparatus having a heat-radiating structure.

2. Description of the Related Art

In general, a display apparatus is equipment for displaying images on a screen, such as a television, a monitor for a computer, a digital information display, and the like. Recently, many display apparatuses are installed outdoors or outside for the purpose of advertising, etc. An example of an outdoor display apparatus is an advertising board installed on the outer wall or roof of a building to display images.

In the outdoor display apparatus, if the display panel is exposed to sunlight, the surface temperature of the display panel rises and causes deterioration of the outdoor display apparatus.

Also, the display apparatus includes a display panel (e.g., a liquid crystal panel), and a backlight unit to irradiate light on the rear surface of the liquid crystal panel. The liquid crystal panel is formed with a pair of substrates facing each other with a liquid crystal layer in between. The backlight unit includes a light source to irradiate light on the liquid crystal panel. The light source of the backlight unit generates light and simultaneously emits heat, which may deteriorate the liquid crystal panel.

Accordingly, the display apparatus includes a heat-radiating structure for preventing deterioration of the liquid crystal panel. In general, the heat-radiating structure is implemented with a structure including a fan and an air filter.

However, since the heat-radiating structure occupies a large volume, there is a limitation in applying the heat-radiating structure to a slim display apparatus. Moreover, a heat-radiating structure including a fan and an air filter requires high maintenance cost since the air filter needs to be replaced with a new one periodically.

SUMMARY

Exemplary embodiments disclosed herein provide an outdoor display apparatus having an improved structure for preventing deterioration of a liquid crystal panel.

The exemplary embodiments may provide an outdoor display apparatus having an improved structure for preventing deterioration of a liquid crystal panel due to sunlight, without using an infrared reflecting layer.

The exemplary embodiments may provide an outdoor display apparatus having an improved structure for implementing a slim product.

The exemplary embodiments may provide an outdoor display apparatus having an improved structure for providing a simple heat-radiating structure while reducing maintenance cost.

Additional aspects of the inventive concept will be set forth in part in the description which follows and, in part, will be obvious from the description, or may be learned by practice of the exemplary embodiments.

According to an aspect of an exemplary embodiment, there is provided a housing; a display module disposed inside the housing, and including a display panel on which an image is displayed; a heat-exchange module disposed on a rear surface of the display module, and configured to concentrate heat inside the housing on a rear surface of the display panel and discharge heat out of the housing; a protective glass disposed to correspond to a display area of the display panel, and configured to transmit infrared light; and a flow path formed inside the housing such that air flowing along the flow path transfers heat from the display panel to the heat-exchange module.

The heat-exchange module may directly contact the rear surface of the display module.

The outdoor display apparatus may further include a heat-transfer member disposed between the display module and the heat-exchange module, and configured to transfer heat received from the display module to the heat-exchange module.

The heat-transfer member may include at least one of a thermal pad and a metal member.

The outdoor display apparatus may further include a control module configured to drive the display module, wherein the flow path includes: a first cooling flow path along which outside air moves, the outside air flowing into the housing through the heat-exchange module; and a second cooling flow path along which inside air moves, the inside air circulating inside the housing and exchanging heat with the outside air in the heat-exchange module to cool the display module and the control module.

The control module may be aligned with the heat-exchange module in a height direction of the outdoor display apparatus.

The heat-exchange module may include: a casing having a first opening and a second opening, wherein the first opening is located on the first cooling flow path, and the second opening is located on the second cooling flow path; and a heat exchanger disposed inside the casing.

The heat-exchange module further includes: a first blower disposed inside the casing and located on the first cooling flow path; and a second blower disposed inside the casing and located on the second cooling flow path.

The housing may have an inlet and an outlet, and the first blower communicates with one of the inlet and the outlet.

The second blower may communicate with one of the first opening and the second opening.

The heat exchanger may include a plurality of channels extending in a height direction of the outdoor display apparatus, and the plurality of channels include: a first channel located on the first cooling flow path; and a second channel located on the second cooling flow path, and disposed alternately with the first channel.

The protective glass may include: a substrate layer formed of a glass material; and a reflection preventing layer disposed on the substrate layer.

According to another aspect of an exemplary embodiment, there is provided an outdoor display apparatus including: a housing having an inlet and an outlet; a display module disposed inside the housing, and including a display panel on which an image is displayed; a heat-exchange module disposed behind the display module, and configured to receive heat from the display module by a heat conduction method; a control module configured to drive the display module; a first cooling flow path along which outside air moves, the outside air entering into the housing through the inlet and exiting the housing through the outlet; and a second cooling flow path interlocked with the first cooling flow path in the heat-exchange module, wherein inside air circulates inside the housing along the second cooling flow path to cool the display module and the control module.

The heat-exchange module may contact a rear surface of the display module.

The outdoor display apparatus may further include a heat-transfer member disposed between the display module and the heat-exchange module, and configured to transfer heat received from the display module to the heat-exchange module.

The outdoor display apparatus may further include a protective glass disposed in front of the display module to protect the display panel, and configured to transmit infrared light, and the protective glass includes: a substrate layer formed of a glass material; and a reflection preventing layer disposed on the substrate layer.

According to yet another aspect of an exemplary embodiment, there is provided an outdoor display apparatus including: a housing; a display module disposed inside the housing, and including a display panel on which an image is displayed; a heat-exchange module disposed adjacent to the display module; a control module configured to drive the display module; a first heat-transfer flow path formed between the display module and the heat-exchange module so that heat received from the display module moves to the heat-exchange module by a heat conduction method; and a second heat-transfer flow path meeting the first heat-transfer flow path in the heat-exchange module, wherein heat received from at least one of the display module and the control module moves along the second heat-transfer flow path.

The second heat-transfer flow path may be configured to move heat received from at least one of the display module and the control module to the heat-exchange module by a convection method.

The housing may include an inlet and an outlet, and the outdoor display apparatus further includes a cooling flow path along which air entered through the inlet moves, and the cooling flow path meeting the first heat-transfer flow path and the second heat-transfer flow path in the heat-exchange module.

BRIEF DESCRIPTION OF THE DRAWINGS

These and/or other aspects of the disclosure will become apparent and more readily appreciated from the following description of the exemplary embodiments, taken in conjunction with the accompanying drawings of which.

DETAILED DESCRIPTION

Hereinafter, embodiments of the present disclosure will be described in detail with reference to the appended drawings. In the following description, the terms "front end", "rear end", "upper portion", "lower portion", "upper end", and "lower end" are defined based on the drawings, and the shapes and positions of the corresponding components are not limited by the terms.

Figure 1:
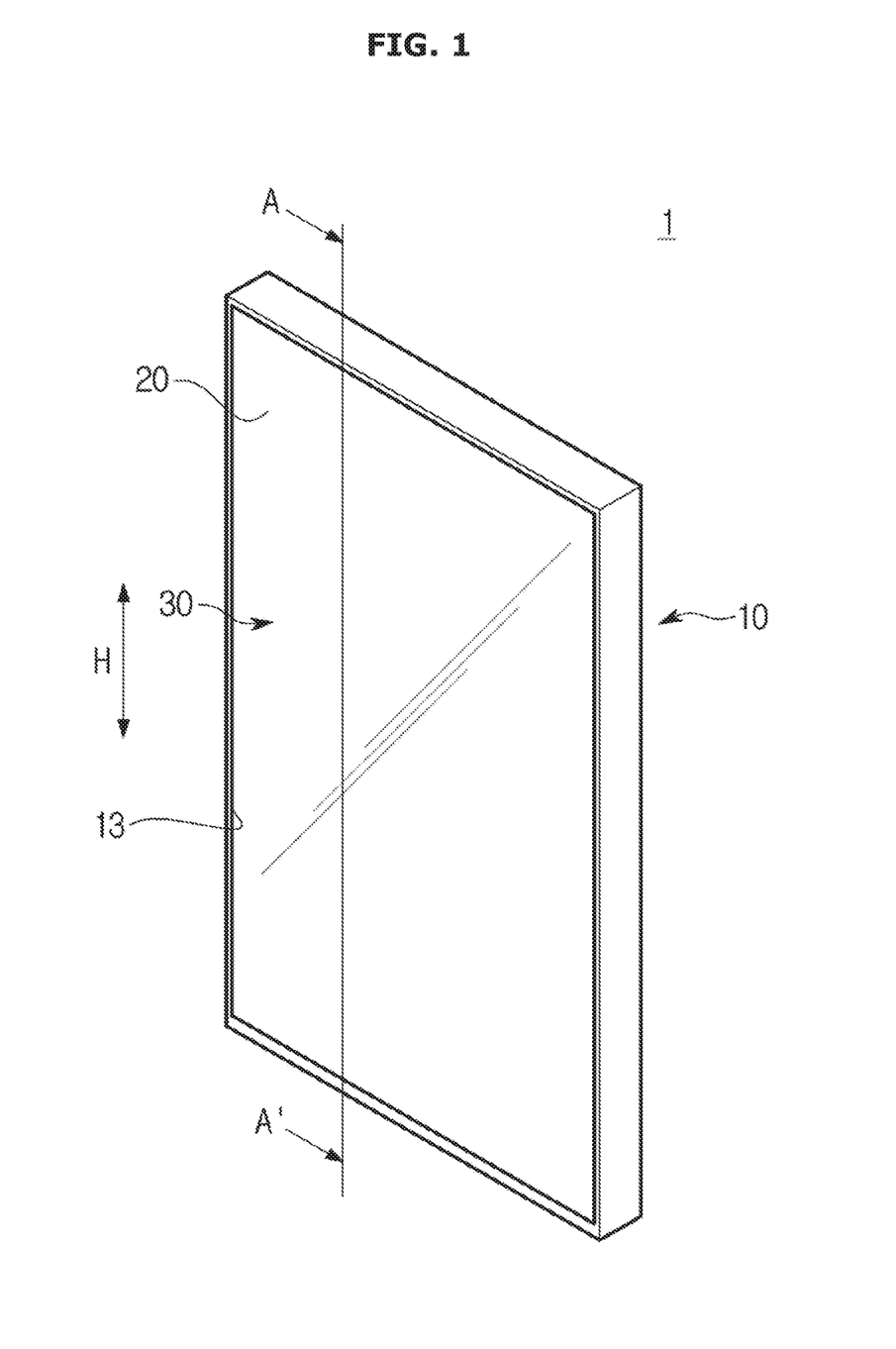
FIG. 1 is a perspective view of an outdoor display apparatus according to an exemplary embodiment.
Figure 2:
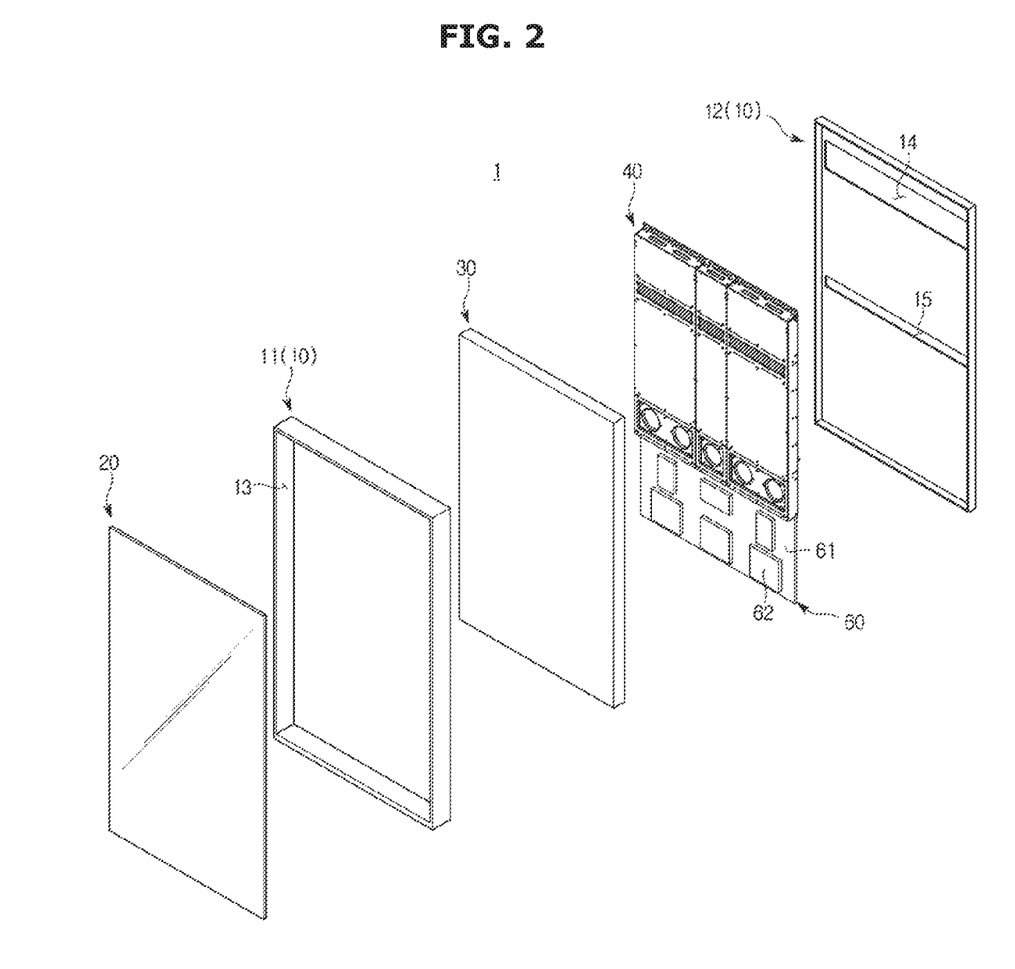
FIG. 2 is an exploded perspective view of an outdoor display apparatus according to an exemplary embodiment.
Figure 3:
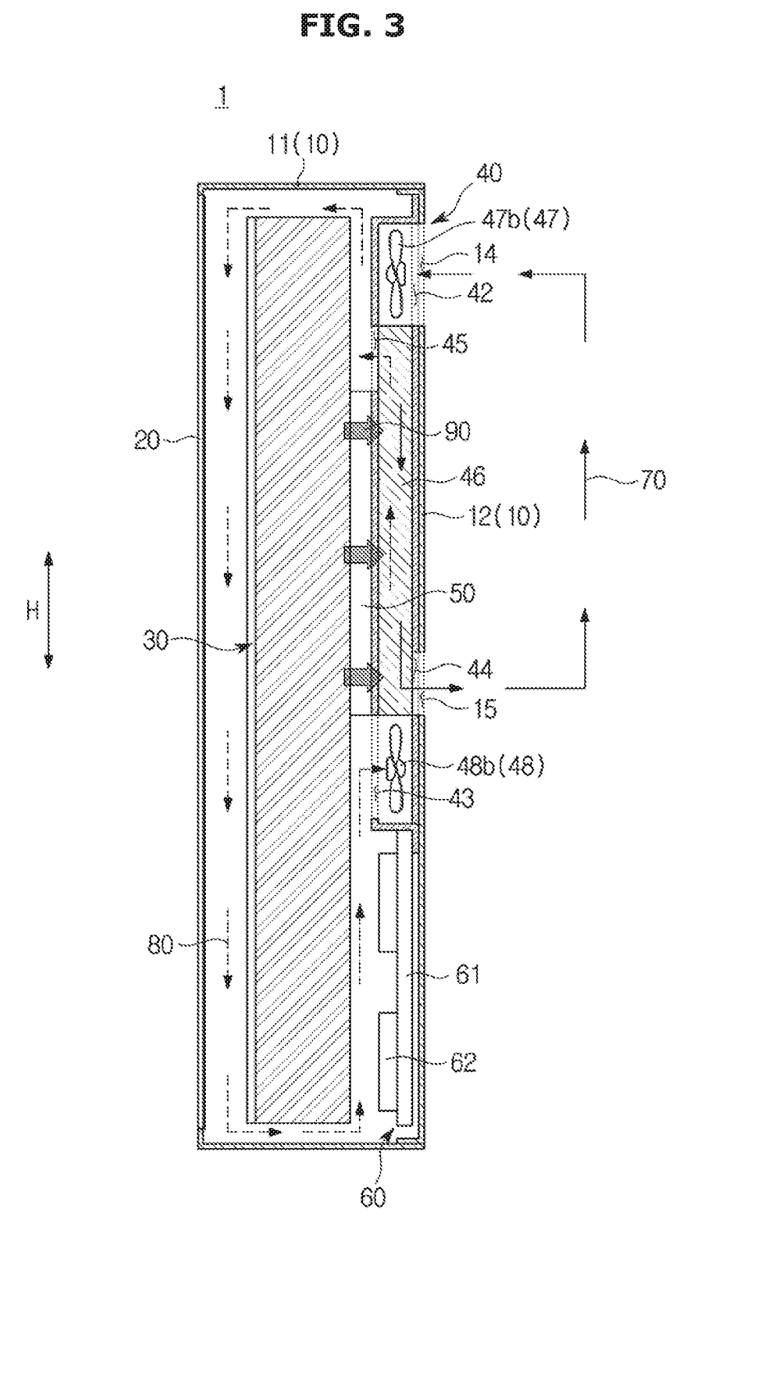
FIG. 3 is a cross-sectional view of the outdoor display apparatus of FIG. 1, taken along a line A-A'.

FIG. 1 is a perspective view of an outdoor display apparatus according to an exemplary embodiment, and FIG. 2 is an exploded perspective view of an outdoor display apparatus according to an exemplary embodiment. FIG. 3 is a cross-sectional view of the outdoor display apparatus of FIG. 1, taken along a line A-A'. In the following description, a cooling flow path 70 will be also referred to as a first cooling flow path 70. Also, a second heat-transfer flow path 80 will be also referred to as a second cooling flow path 80. Reference numerals not described below will be able to be understood by referring to FIGS. 6, 7, and 8. FIG. 2 shows a case in which a plurality of heat-exchange modules having different sizes are applied.

As shown in FIGS. 1, 2, and 3, an outdoor display apparatus 1 may include a housing 10 forming an outer appearance. The housing 10 may be installed outdoor. The housing 10 may have an opening 13. More specifically, the opening 13 may be formed in the front surface of the housing 10. Also, the housing 10 may have an inlet 14 and an outlet 15.

The housing 10 may include a first frame 11 and a second frame 12. The first frame 11 may be in the shape of a box without front or rear surfaces. The open front of the first frame 11 may be defined as the opening 13. That is, the opening 13 may be formed in the front of the first frame 11.

The second frame 12 may be coupled with the first frame 11. More specifically, the second frame 12 may be coupled with the open rear of the first frame 11 to form the outer appearance of the outdoor display apparatus 1 together with the first frame 11. The inlet 14 and the outlet 15 may be formed in the second frame 12. The inlet 14 may be formed in an upper portion of the second frame 12 so that outside air can flow into the inside of the housing 10. The outlet 15 may be formed in a center portion of the second frame 12 so that the outside air entered the inside of the housing 10 through the inlet 14 can be discharged to the outside of the housing 10. The outlet 15 may be located below the inlet 14 in the second frame 12. However, the locations of the inlet 14 and the outlet 15 are not limited thereto, and the inlet 14 and the outlet 15 may be located at any other positions.

Figure 5:
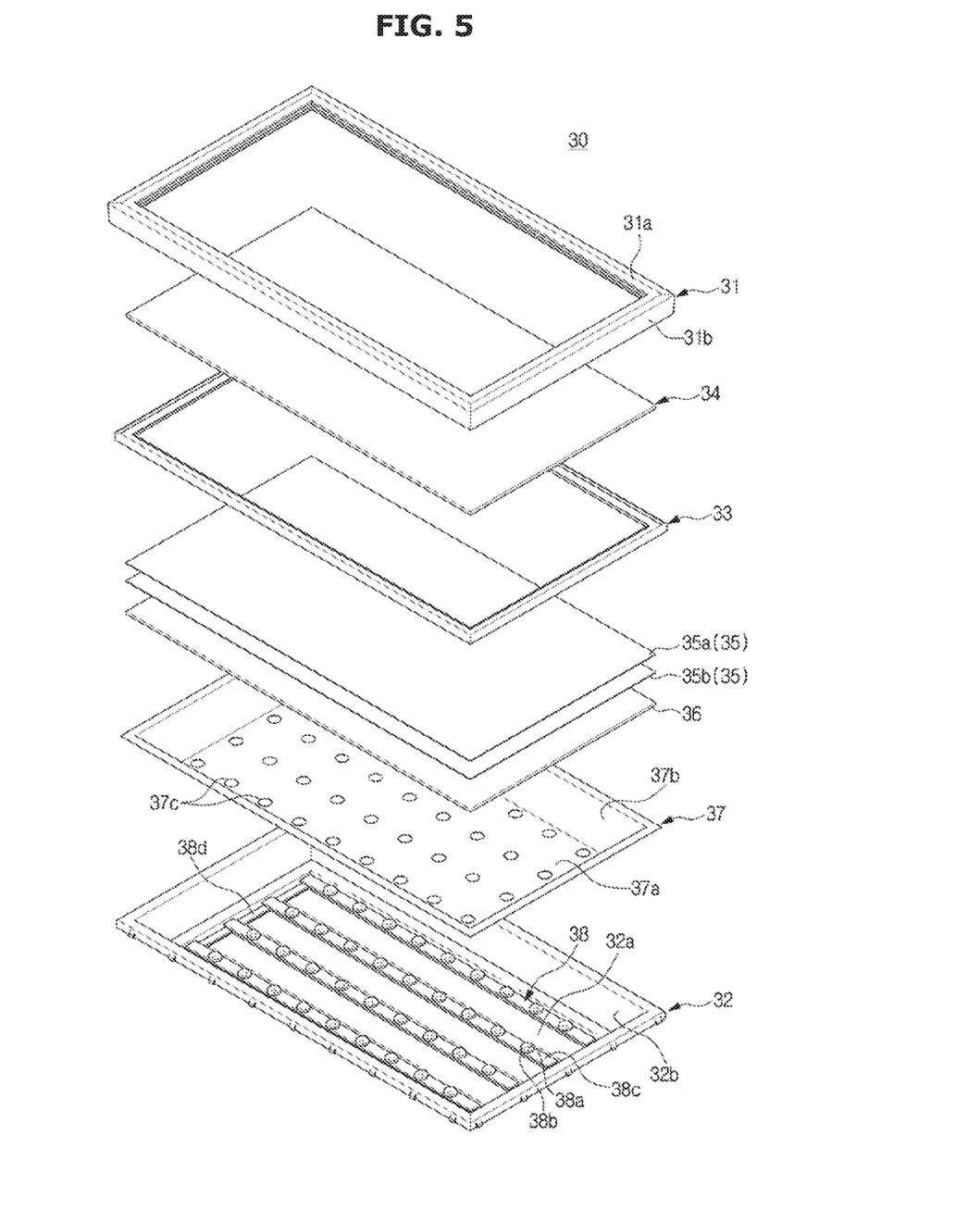
FIG. 5 is an exploded perspective view of a display module in an outdoor display apparatus according to an exemplary embodiment.

The outdoor display apparatus 1 may further include a protective glass 20 to protect a display panel 34 (see FIG. 5). The protective glass 20 may be disposed in front of a display module 30 to protect the display panel 34. More specifically, the protective glass 20 may be coupled with the opening 13 of the housing 10.

The protective glass 20 may have a size corresponding to a size of the display module 30. Specifically, the protective glass 20 may have a size corresponding to a size of the display panel 34. More specifically, the protective glass 20 may be disposed to correspond to a display area of the display panel 34 on which an image is displayed.

The outdoor display apparatus 1 may further include the display module 30. The display module 30 may be disposed in the inside of the housing 10. The display module 30 may be disposed in the inside of the housing 10 to be located behind the protective glass 20. Also, the display module 30 may be disposed in the inside of the housing 10 such that heat can be concentrated behind the display panel 34 rather than in front of the display panel 34.

The outdoor display apparatus 1 may further include a heat-exchange module 40. The heat-exchange module 40 may be disposed behind the display module 30. The heat-exchange module 40 may be coupled with the rear surface of the display module 30 so as to receive heat from the display module 30 by a heat conduction method. In other words, the heat-exchange module 40 may be disposed on the rear surface of the display module 30 such that heat from the inside of the housing 10 can be concentrated in a rear direction of the display panel 34. That is, the heat-exchange module 40 may be disposed on the rear surface of the display module 30 so that heat from the inside of the housing 10 can be concentrated behind the display panel 34 and dissipated. At this time, the heat from the inside of the housing 10 may be generated from at least one of the display module 30 and the control module 60. Also, the heat from the inside of the housing 10 may be generated by sunlight incident to the outdoor display apparatus 1. Heat from the inside of the housing 10 may be concentrated on the heat-exchange module 40 by a heat conduction method.

The outdoor display apparatus 1 may further include a heat-transfer member 50 (see FIG. 3). The heat-transfer member 50 may be disposed between the display module 30 and the heat-exchange module 40 to transfer heat received from the display module 30 to the heat-exchange module 40. More specifically, the heat-transfer member 50 may be disposed closely between the display module 30 and the heat-exchange module 40 to transfer heat received from the display module 30 to the heat-exchange module 40 by a heat conduction method.

The heat-transfer member 50 may function to remove air existing between the display module 30 and the heat-exchange module 40. This is because air may prevent heat, which is generated from the display module 30 or passed through the display module 30, from being transferred to the heat-exchange module 40. The heat-transfer member 50 may be disposed closely between the display module 30 and the heat-exchange module 40 to remove air existing between the display module 30 and the heat-exchange module 40. As a result, the heat-transfer member 50 may cause heat generated by the display module 30 or passed through the display module 30 to be effectively transferred to the heat-exchange module 40.

The heat-transfer member 50 may include at least one of a thermal pad and a metal member. For example, the thermal pad may include a heat conductive resin layer and a heat conductive metal layer. The heat conductive resin layer may include silicon. Also, the heat conductive metal layer may include metal filler such as aluminum. However, the kind of the thermal pad is not limited to these. For example, the metal member may include aluminum, although not limited thereto.

The outdoor display apparatus 1 may further include a control module 60. The control module 60 may be installed in the inside of the housing 10 to drive the display module 30.

The control module 60 may be aligned with the heat-exchange module 40 in a height direction H of the outdoor display apparatus 1. As such, the outdoor display apparatus 1 may be slim and have an uniform thickness in the height direction H.

The control module 60 may be disposed below the heat-exchange module 40. However, the control module 60 may be disposed at any other location, as long as the control module 60 is aligned with the heat-exchange module 40 in the height direction H of the outdoor display apparatus 1. That is, the control module 60 may be disposed above the heat-exchange module 40.

The control module 60 may include a circuit board 61.

The control module 60 may further include at least one electric component 62 mounted on the circuit board 61. The at least one electric component 62 may include CPU, SMPS, LD, etc. which exchange information with each other to perform functions.

Sunlight incident to the front surface of the outdoor display apparatus 1 may raise temperature of the display panel 34. Also, a backlight unit (BLU) 38 (see FIG. 5) disposed to supply light to the display panel 34 may function as a heating element to raise inside temperature of the housing 10. Also, the control module 60 may emit heat when driving the display module 30 and raise inside temperature of the housing 10. If the inside temperature of the housing 10 rises, temperature of the display panel 34 may rise accordingly. If the display panel 34 is heated excessively, the display panel 34 may deteriorate. In order to prevent deterioration of the display panel 34, the outdoor display apparatus 1 may further include the following components.

The outdoor display apparatus 1 may further include a flow path formed in the inside of the housing 10 to reduce heat transferred from at least one of the display module 30 and the control module 60.

The flow path may include a first cooling flow path 70 and a second cooling flow path 80. Air entered through the inlet 14 of the housing 10 may move along the first cooling flow path 70. The first cooling flow path 70 may connect the inlet 14 to the outlet 15.

The second cooling flow path 80 may meet the first cooling flow path 70 in the heat-exchange module 40. In other words, the second cooling flow path 80 may be interlocked with the first cooling flow path 70 in the heat-exchange module 40. Air moving along the first cooling flow path 70 may exchange heat with air moving along the second cooling flow path 80, without being mixed with the air moving along the second cooling flow path 80. Air exchanged heat with the air moving along the first cooling flow path 70 in the heat-exchange module 40 may circulate along the second cooling flow path 80 to cool the display module 30 and the control module 60.

The second cooling flow path 80 may be formed along the circumference of the display module 30.

The second cooling flow path 80 may be in the form of a closed loop.

On the first cooling flow path 70, a first channel 46a (see FIG. 8) of a heat exchanger 46 may be located. On the second cooling flow path 80, a second channel 46b (see FIG. 8) of the heat exchanger 46 may be located. Relatively warm air moving along the second cooling flow path 80 may exchange heat with relatively cold air moving along the first cooling flow path 70 in the heat exchanger 46. Thereby, the display panel 34 may be prevented from being excessively heated, and as a result, the display panel 34 may be prevented from deteriorating.

Hereinafter, the outdoor display apparatus 1 will be described in view of heat-transfer.

The outdoor display apparatus 1 may further include a first heat-transfer flow path 90. The first heat-transfer flow path 90 may be disposed between the display module 30 and the heat-exchange module 40 to move heat transferred from the display module 30 to the heat-exchange module 40. At this time, the heat may move by a heat conduction method.

The outdoor display apparatus 1 may further include a second heat-transfer flow path 80. As aforementioned, the second heat-transfer flow path 80 is the same as the second cooling flow path 80. The second heat-transfer flow path 80 may meet the first heat-transfer flow path 90 in the heat-exchange module 40. The second heat-transfer flow path 80 may move heat transferred from at least one of the display module 30 and the control module 60 to the heat-exchange module 40. At this time, the heat may move by a convection method.

The second heat-transfer flow path 80 may be formed along the circumference of the display module 30.

The second heat-transfer flow path 80 may be in the form of a closed loop.

The outdoor display apparatus 1 may further include a cooling flow path 70. The cooling flow path 70 may move air entered through the inlet 14. The cooling flow path 70 may connect the inlet 14 to the outlet 15. The cooling flow path 70 may meet the first heat-transfer flow path 90 and the second heat-transfer flow path 80 in the heat-exchange module 40. On the cooling flow path 70, the first channel 46*a* (see FIG. 8) of the heat exchanger 46 may be located. At an area where the first heat-transfer flow path 90 meets the second heat-transfer flow path 80, the second channel 46*b* (see FIG. 8) of the heat exchanger 46 may be located. Relatively warm air moving along the first heat-transfer flow path 90 and the second heat-transfer flow path 80 may exchange heat with relatively cold air moving along the cooling flow path 70 in the heat exchanger 46. In this process, heat generated from at least one of the display module 30 and the control module 60 may be removed.

Figure 4:
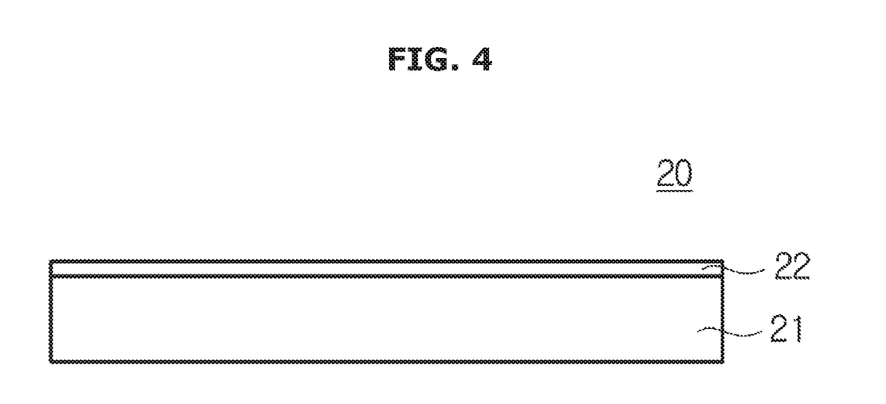
FIG. 4 shows a protective glass in an outdoor display apparatus according to an exemplary embodiment.

FIG. 4 shows a protective glass in an outdoor display apparatus according to an exemplary embodiment.

As shown in FIG. 4, the protective glass 20 may include a substrate layer 21. The substrate layer 21 may be formed of a glass material having sufficient stiffness.

The protective glass 20 may further include a reflection-preventing layer 22 mounted on the substrate layer 21. The reflection-preventing layer 22 may be mounted on the front surface of the substrate layer 21 in order to reduce an amount of light reflected by the substrate layer 21 to improve visibility of the outdoor display apparatus 1. The reflection-preventing layer 22 may be formed on the substrate layer 21 by a sputtering method.

The protective glass 20 may include no infrared reflecting layer. That is, the protective glass 20 may transmit infrared light. Generally, an infrared reflecting layer may reflect sunlight passed through the substrate layer 21 to reduce sunlight to be transferred to the display panel 34. The infrared reflecting layer may include a polarizing film and a plurality of 1/λ films. Since the outdoor display apparatus 1 according to an exemplary embodiment can concentrate sunlight and heat generated by various heating elements on the heat-exchange module 40 to thereby effectively dissipate heat, so the outdoor display apparatus 1 may omit an infrared reflecting layer among components of the protective glass 20.

FIG. 5 is an exploded perspective view of a display module 30 in an outdoor display apparatus according to an exemplary embodiment.

As shown in FIG. 5, the display module 30 may include a top chassis 31 forming a front outer appearance, a bottom chassis 32 forming a rear outer appearance, and a mold frame 33 disposed between the top chassis 31 and the bottom chassis 32.

The surface of the top chassis 31 may have a same level with the surface of the display panel 34 on which images are displayed, to prevent the edges of the display panel 34 from being exposed to the outside. The top chassis 31 may include a bezel portion 31*a* covering the front edges of the display panel 34, and a top side portion 31*b* bent in a rear direction from the edges of the bezel portion 31*a*.

The bottom chassis 32 may be disposed on the other surface of the display panel 34. Also, the bottom chassis 32 may protect various components included in the display module 30 from external impacts. The backlight unit 38 may be installed in the bottom chassis 32. The bottom chassis 32 may be formed in the shape of a rectangle, although not limited thereto. The bottom chassis 32 may include a bottom rear portion 32*a* on which the backlight unit 38 is rested, and a bottom side portion 32*b* extending in a front direction from the edges of the bottom rear portion 32*a*. In the bottom rear portion 32*a*, a resting groove (not shown) may be concavely formed to rest a circuit board 38*c* of the backlight unit 38 thereon.

The mold frame 33 may support the display panel 34 and a light-diffusion plate 36. The mold frame 33 may support the display panel 34 disposed in the front direction of the mold frame 33, and the light-diffusion plate 36 disposed in the rear direction of the mold frame 33. The top chassis 31 may be disposed in front of the mold frame 33 so that the display panel 34 is installed and maintained in the mold frame 33. The bottom chassis 32 may be installed behind the mold frame 33.

On the display panel 34, a screen may be provided. The display panel 34 may display various images on the screen according to image signals received from the outside. At this time, the display panel 34 may be one of an emissive display panel which creates images using light generated by a plurality of pixels constituting the display panel 34, and a non-emissive display panel which creates images by reflecting/transmitting/blocking light through a plurality of pixels. Hereinafter, the display panel 34 is assumed to be a non-emissive display panel which creates images by reflecting/transmitting/blocking light irradiated from the backlight unit 38.

Although not shown in FIG. 5, the display panel 34 may further include a liquid crystal layer, a transparent electrode layer, a transparent substrate, and a color filter, etc. A liquid crystal layer may include an appropriate amount of liquid crystals. Herein, the liquid crystals may be in an intermediate state between a crystal and a solid. The liquid crystals may show optical properties according to a change in voltage. For example, the orientation of molecules constituting the liquid crystals may change according to a change of an electrical field applied thereto. At both edges of the liquid crystal layer, a pair of transparent electrode layers may be provided to form a changing electric field in the liquid crystal layer. An electric field to be applied to the liquid crystal layer may change according to a voltage applied between the pair of transparent electrode layers. The transparent electrode layers may include gate lines, data lines, and Thin Film Transistors (TFTs). A pair of transparent substrates may form an outer appearance of the display panel 34 to protect the liquid crystal layer and the transparent electrode layers. The transparent substrates may be formed of tempered glass or a transparent film having high light transmittance.

A color filter may include a red filter, a blue filter, and a green filter respectively formed in areas corresponding to the plurality of pixels constituting the display panel 34 so that the individual pixels can display colors. As such, the display panel 34 may create an image by blocking or transmitting light generated by the backlight unit 38 which will be described later. More specifically, the individual pixels constituting the display panel 34 may block or transmit light from the backlight unit 38 to thereby create various colors of an image.

The display module 30 may further include the backlight unit 38 to supply light to the display panel 34. The backlight unit 38 may be disposed behind the display panel 34 in such a way to be spaced apart from the display panel 34.

The backlight unit 38 may include a plurality of light sources 38a to generate light. The plurality of light sources 38a may be elements to radiate light. The plurality of light sources 38a may be Light Emitting Diodes (LEDs) or any other element or device to generate and radiate light. The plurality of light sources 38a may be arranged on a front surface of the circuit board 38c to face the light-diffusing plate 36. Also, the plurality of light sources 38a may irradiate light toward the display panel 34.

Also, the backlight unit 38 may further include a plurality of lenses 38b surrounding the plurality of light sources 38a independently. The plurality of lenses 38b may be respectively installed on the plurality of light sources 38a to diffuse light generated by the plurality of light sources 38a. Each of the plurality of lenses 38b may have a circular shape, although not limited to this. The plurality of lenses 38b may be formed of a resin material having transparency. For example, the plurality of lenses 38b may be formed of polycarbonate (PC), polymethyl methacrylate (PMMA), acrylic, or the like, although not limited to these. That is, the plurality of lenses 38b may be formed of any other material such as glass.

Also, the backlight unit 38 may further include the circuit board 38c on which the plurality of light sources 38a are mounted. The circuit board 38c may include at least one among a Printed Circuit Board (PCB) and a Flexible Copper Clad Laminate (FCCL).

The circuit board 38c may be disposed on the bottom chassis 32. The circuit board 38c may extend in one direction to correspond to the display panel 34. On the circuit board 38c, a conductive pattern may be formed. The plurality of light sources 38a may be electrically connected to the circuit board 38c through wire bonding or flip chip bonding.

The backlight unit 38 may include a plurality of circuit boards 38c that are arranged in parallel and spaced apart from each other. On each circuit board 38c, the plurality of light sources 38a and the plurality of lenses 38b may be arranged in a longitudinal direction of the circuit board 38c in such a way to be spaced apart from each other. The plurality of circuit boards 38c may be connected to each other through a connection board 38d.

Also, the backlight unit 38 may further include a reflector sheet 37 disposed behind the circuit board 38c. The reflector sheet 37 may be disposed on the inner surface of the bottom chassis 32. The reflector sheet 37 may reflect light irradiated toward the inner surface of the bottom chassis 32 toward the display panel 34.

The reflector sheet 37 may include a sheet rear portion 37a disposed on the inner surface of the bottom rear portion 32a forming the rear surface of the bottom chassis 32, and a sheet side portion 37b extending in the front direction from the edges of the sheet rear portion 37a.

In the sheet rear portion 37a, a plurality of through holes 37c may be formed. More specifically, the through holes 37c may be formed in the sheet rear portion 37a to respectively correspond to the plurality of light sources 38a and the plurality of lenses 38b. The plurality of light sources 38a and the plurality of lenses 38b may protrude toward the inside of the reflector sheet 37 through the through holes 37c. Accordingly, light generated by the plurality of light sources 38a may be transferred to the display panel 34 disposed in the front direction, and light reflected in the rear direction by the light-diffusing plate 36, etc. may be again reflected in the front direction by the reflector sheet 37.

The sheet side portion 37b may extend in the front direction from the edges of the sheet rear portion 37a, that is, the upper, lower, left, and right ends of the sheet rear portion 37a. The sheet side portion 37b may be inclined to face the rear surface of the display panel 34 to reflect light transferred from the plurality of light sources 38a in the front direction. Since the light-diffusing plate 36 is disposed behind the display panel 34, the sheet side portion 37b may be inclined to face the rear surface of the light-diffusing plate 36.

Also, the backlight unit 38 may further include a Quantum Dot Sheet (QDS) (not shown) to receive light irradiated from the plurality of light sources 38a to output white light (mixed light of various colors of light).

The display module 30 may further include the light-diffusing plate 36 to diffuse light irradiated from the backlight unit 38 and transfer the diffused light to the display panel 34. The light-diffusing plate 36 may be disposed behind the display panel 34.

The display module 30 may further include an optical sheet 35 disposed on a front surface of the light-diffusing plate 36. The optical sheet 35 may be rested on the front surface of the light-diffusing plate 36. The optical sheet 35 may include a prism film 35b to concentrate light diffused by the light-diffusing plate 36 vertically onto the display panel 34. The optical sheet 35 may further include a protective film 35a to protect the prism film 35b. The protective film 35a may be disposed on a front surface of the prism film 35b. The protective film 35a may protect various components included in the backlight unit 38 from external impacts or foreign materials. Particularly, since the prism film 35b is vulnerable to scratches, the protective film 35a may be disposed on the front surface of the prism film 35b to prevent scratches from being made on the prism film 35b. The optical sheet 35 may further include a Double Brightness Enhance Film (DBEF) disposed on a front surface of the protective film 35a. The DBEF may be a kind of a polarizing film, and also called a reflective polarizing film. The DBEF may transmit light that is parallel to a polarization direction of the DBEF among light irradiated from the backlight unit 38, and reflect light that is different from the polarization direction of the DBEF among the irradiated light. The reflected light may be recycled in the inside of the backlight unit 38 to improve a brightness of the display module 30.

The display module 30 having a direct type backlight unit in which the light sources 38a are disposed directly below the display panel 34 has been described above. However, an edge type backlight unit in which the light sources 38a are disposed along at least one sides of a plurality of longer sides and a plurality of shorter sides of the display panel 34 may be applied to the display module 30.

Figure 6:
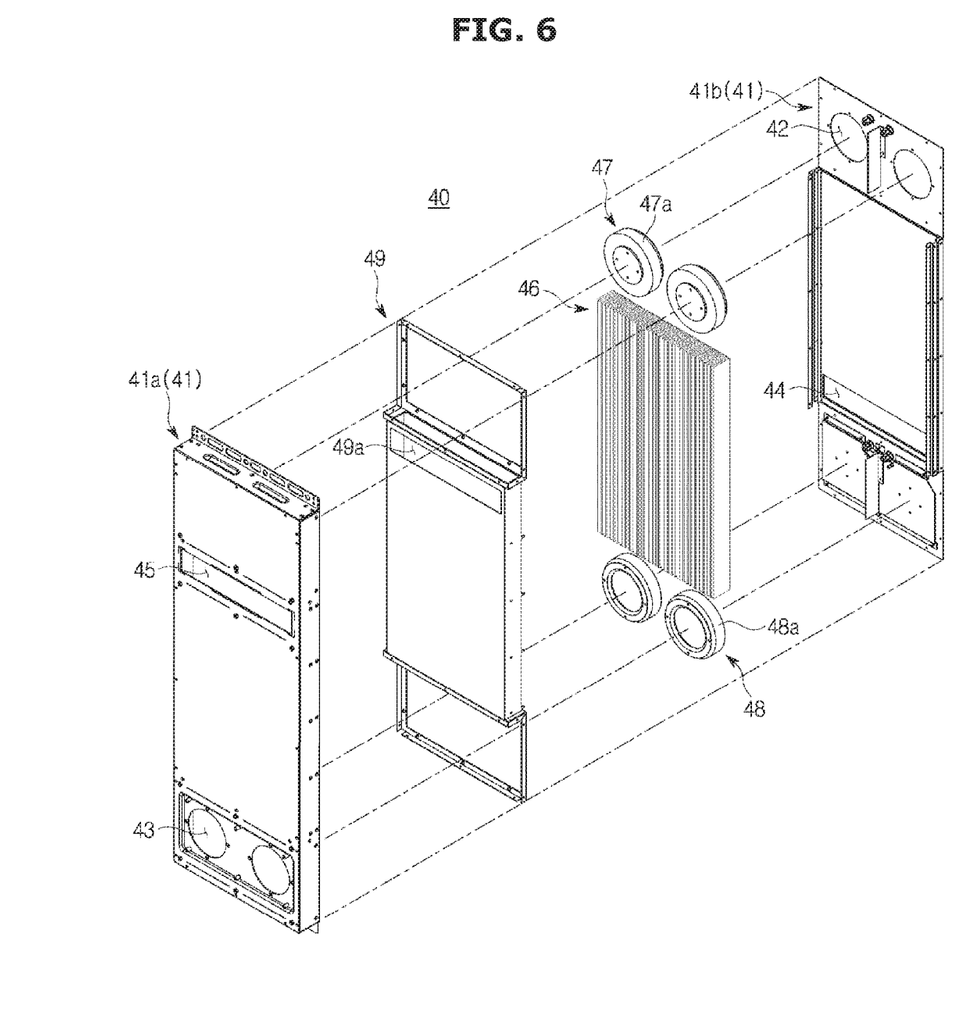
FIG. 6 is an exploded perspective view of a heat-exchange module in an outdoor display apparatus according to an exemplary embodiment.
Figure 7:
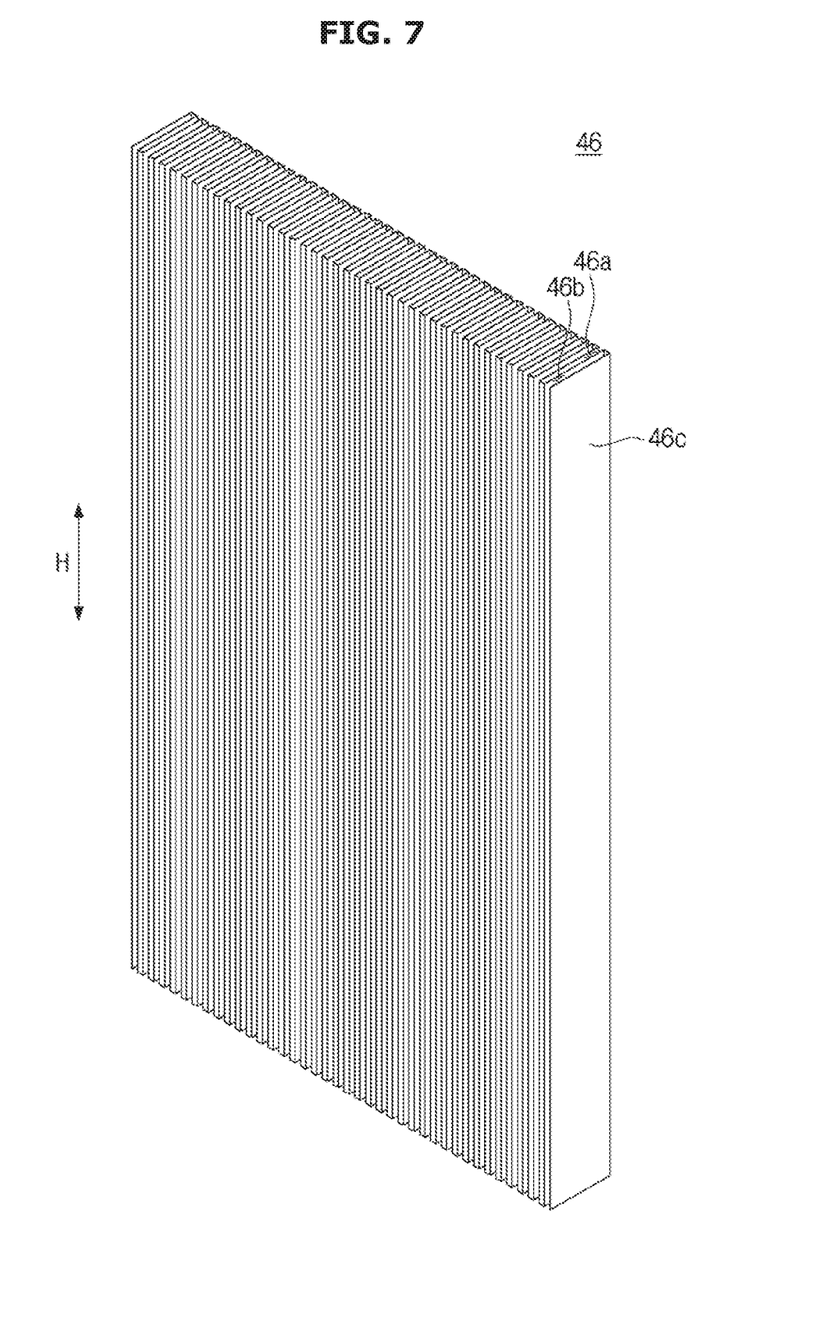
FIG. 7 is a perspective view of a heat exchanger in an outdoor display apparatus according to an exemplary embodiment.
Figure 8:
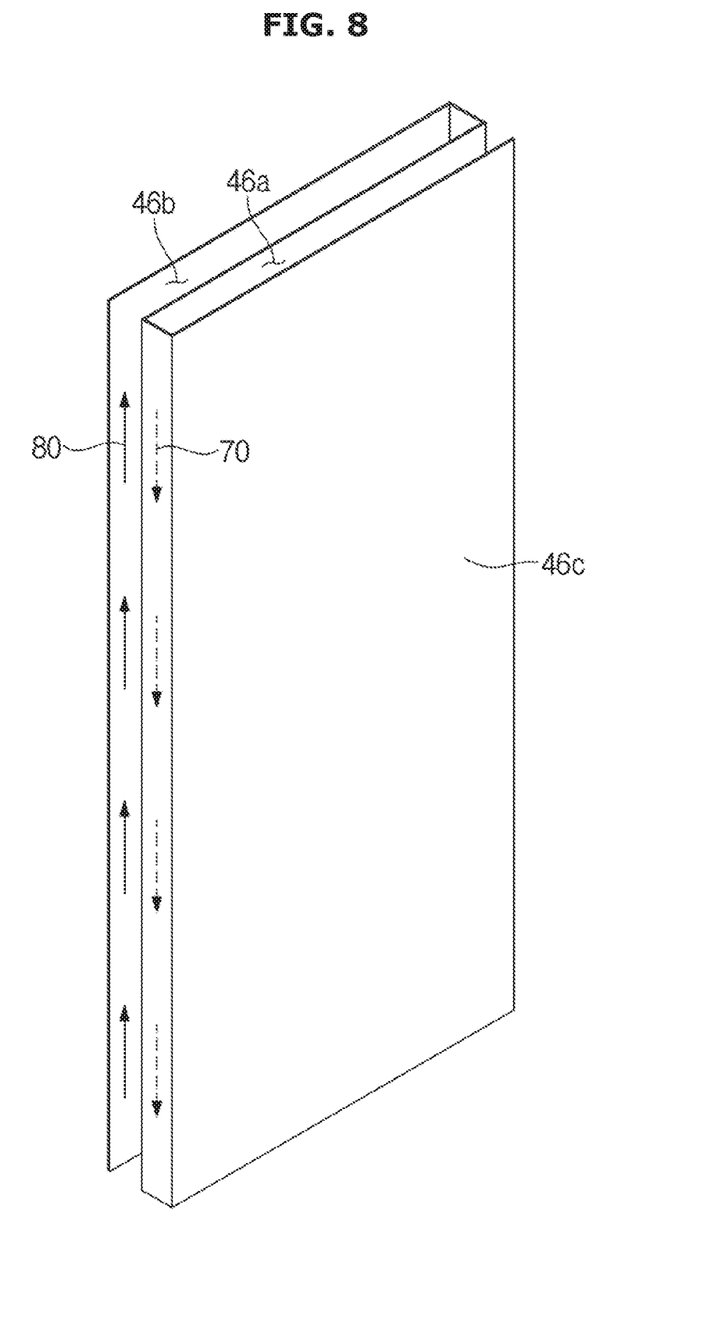
FIG. 8 is an enlarged view showing a portion of FIG. 7. Reference numerals of components not shown in FIGS. 6, 7, and 8 will be able to be understood by referring to FIG. 3.

FIG. 6 is an exploded perspective view of a heat-exchange module 40 in an outdoor display apparatus according to an exemplary embodiment. FIG. 7 is a perspective view of a heat exchanger 46 in an outdoor display apparatus according to an exemplary embodiment. FIG. 8 is an enlarged view showing a portion of FIG. 7. Reference numerals of components not shown in FIGS. 6, 7, and 8 will be able to be understood by referring to FIG. 3.

As shown in FIGS. 6, 7, and 8, the heat-exchange module 40 may include a casing 41 forming an outer appearance. The casing 41 may have a first opening 42 and a second opening 43. The first opening 42 and the second opening 43 may be respectively formed in the opposite sides of the casing 41. The first opening 42 may be located on the first cooling flow path 70 (see FIG. 3), and the second opening 43 may be located on the second cooling flow path 80 (see FIG. 3).

The casing 41 may include a first casing 41a. The first casing 41a may face the display module 30. More specifically, the first casing 41a may face the display module 30 to form the front outer appearance of the heat-exchange module 40. In the first casing 41a, the second opening 43 may be formed. The second opening 43 may be formed in a lower portion of the first casing 41a, Also, in the first casing 41a, a second communicating portion 45 located on the second cooling flow path 80 may be formed. Air entered into the inside of the casing 41 through the second opening 43 may pass through a second blower 48 and the heat exchanger 46 sequentially, and then be discharged to the outside of the casing 41 through the second communicating portion 45. The second communicating portion 45 may be formed in the first casing 41a to be located above the second opening 43. However, the locations of the second communicating portion 45 and the second opening 43 are not limited thereto, and the second communicating portion 45 and the second opening 43 may be positioned at any other locations.

The casing 41 may further include a second casing 41b. The second casing 41b may face the second frame 12 of the housing 10. More specifically, the second casing 41b may face the second frame 12 to form the rear outer appearance of the heat-exchange module 40. In the second casing 41b, the first opening 42 may be formed. The first opening 42 may be formed in an upper portion of the second casing 41b. Also, in the second casing 41b, a first communicating portion 44 located on the first cooling flow path 70 may be formed. Outside air entered into the inside of the casing 41 through the first opening 42 may pass through a first blower 47 and the heat exchanger 46 sequentially, and then be discharged to the outside of the casing 41 through the first communicating portion 44. The first communicating portion 44 may be formed in the second casing 41b to be located below the first opening 42. However, the locations of the first communicating portion 44 and the first opening 42 are not limited thereto, and the first communicating portion 44 and the first opening 42 may be positioned at any other locations.

The first opening 42 may be formed to correspond to the inlet 14, and the first communicating portion 44 may be formed to correspond to the outlet 15.

The heat-exchange module 40 may further include the heat exchanger 46 disposed in the inside of the casing 41.

The heat exchanger 46 may include a plurality of channels extending in the height direction H of the outdoor display apparatus 1.

The plurality of channels may include a first channel 46a located on the first cooling flow path 70. The first channel 46a may face the second casing 41b.

The plurality of channels may further include a second channel 46b located on the second cooling flow path 80, The second channel 46b may face a support frame 49 which will be described later. In other words, the second channel 46b may face the display panel 34. The second channel 46b and the first channel 46a may be disposed alternately.

The heat exchanger 46 may further include a heat exchange fin 46c to partition the plurality of channels. The heat exchange fin 46c may prevent air moving along the first channel 46a from being mixed with air moving along the second channel 46b.

The heat-exchange module 40 may further include the first blower 47. The first blower 47 may be disposed in the inside of the casing 41 to be positioned above the first cooling flow path 70. The first blower 47 may be disposed above the heat exchanger 46. The first blower 47 may communicate with the inlet 14. The first blower 47 may include a first blow case 47a, and a first blow fan 47b (see FIG. 3) accommodated in the first blow case 47a. The first blow fan 47b may generate suction power so that outside air enters the inside of the casing 41 through the first opening 42. The first blow case 47a may be fixed at and coupled with the first casing 41a. The first blower 47 may further include a motor to drive the first blow fan 47b.

The heat-exchange module 40 may further include a second blower 48. The second blower 48 may be disposed in the inside of the casing 41 to be located on the second cooling flow path 80. The second blower 48 may be disposed below the heat exchanger 46. The second blower 48 may communicate with the second opening 43. The second blower 48 may include a second blow case 48a, and a second blow fan 48b (see FIG. 3) accommodated in the inside of the second blow case 48a. The second blow fan 48b may generate suction power so that air enters the inside of the casing 41 through the second opening 43. The second blow case 48a may be fixed at and coupled with the second casing 41b. The second blower 48 may further include a motor to drive the second blow fan 48b.

The heat-exchange module 40 may further include a support frame 49. The support frame 49 may be disposed in the inside of the casing 41 to support the first blower 47, the heat exchanger 46, and the second blower 48. Also, the support frame 49 may be disposed between the first casing 41a and the second casing 41b to partition the first blower 47, the heat exchanger 46, and the second blower 48. In the support frame 49, a communicating hole 49a may be formed to correspond to the second communicating portion 45. Air moving along the second channel 46b of the heat exchanger 46 may pass through the communicating hole 49a and the second communicating portion 45 sequentially, and be discharged to the outside of the heat-exchange module 40.

Outside air may move along the first cooling flow path 70. Relatively cold outside air may pass through the inlet 14 and the first opening 42 sequentially by suction power from the first blow fan 47b to enter the first channel 46a of the heat exchanger 46. Outside air moving along the first channel 46a may exchange heat with inside air moving along the second channel 46b. Through this process, the inside air may be cooled. The outside air may exchange heat with the inside air. pass through the first communicating portion 44 and the outlet 15 sequentially, and be discharged to the outside of the outdoor display apparatus 1.

The inside air may move along the second cooling flow path 80. The inside air may be heated by sunlight, the display module 30, the control module 60, etc. Accordingly, the inside air may be relatively warm. The inside air may pass through the second opening 43 by suction power from the second blow fan 48*b* to enter the second channel 46*b* of the heat exchanger 46. While the inside air moves along the second channel 46*b*, the inside air may exchange heat with outside air moving along the first channel 46*a*. At this time, the inside air may lose heat by transferring the heat to the outside air and become cooler than before. Then, the inside air may pass through the communicating hole 49*a* and the second communicating portion 45 sequentially, and then be discharged toward the display module 30. The inside air discharged to the outside of the heat-exchange module 40 may circulate along the circumference of the display module 30.

Figure 9:
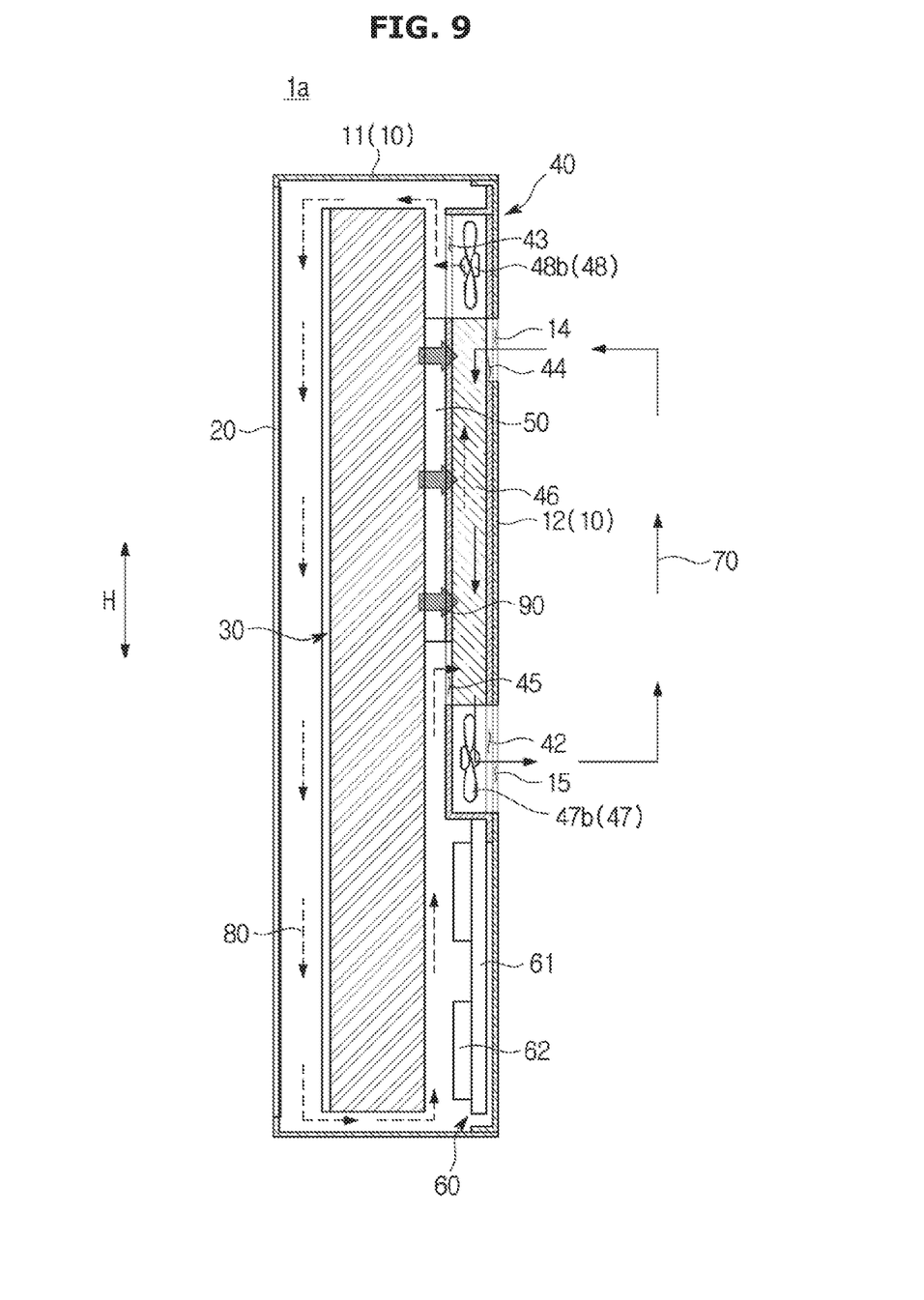
FIG. 9 is a cross-sectional view of an outdoor display apparatus according to another exemplary embodiment.

FIG. 9 is a cross-sectional view of an outdoor display apparatus according to another exemplary embodiment. Hereinafter, descriptions overlapping with those described above with reference to FIGS. 1 to 8 will be omitted. Reference numerals not shown in FIG. 9 will be able to be understood by referring to FIGS. 1 to 8. Hereinafter, the support frame 49 will be omitted. A reference numeral "1*a*" indicates the outdoor display apparatus.

Referring to FIG. 9, the casing 41 may include the first casing 41*a*. The first casing 41*a* may face the display module 30. More specifically, the first casing 41*a* may face the display module 30 to form the front outer appearance of the heat-exchange module 40. In the first casing 41*a*, the second opening 43 may be formed. The second opening 43 may be formed in the upper portion of the first casing 41*a*. Also, in the first casing 41*a*, the second communicating portion 45 located on the second cooling flow path 80 may be formed. Air entered into the inside of the casing 41 through the second communicating portion 45 may pass through the heat exchanger 46 and the second blower 48 sequentially, and then be discharged to the outside of the casing 41 through the second opening 43, The second communicating portion 45 may be formed in the first casing 41*a* to be located below the second opening 43. However, the locations of the second communicating portion 45 and the second opening 43 are not limited to the above example, and the second communicating portion 45 and the second opening 43 may be positioned at any other locations.

The casing 41 may further include the second casing 41*b*. The second casing 41*b* may face the second frame 12 of the housing 10. More specifically, the second casing 41*b* may face the second frame 12 to form the rear outer appearance of the heat-exchange module 40. In the second casing 41*b*, the first opening 42 may be formed. The first opening 42 may be formed in a lower portion of the second casing 41*b*. Also, in the second casing 41*b*, the first communicating portion 44 located on the first cooling flow path 70 may be formed. Outside air entered into the inside of the casing 41 through the first communicating portion 44 may pass through the heat exchanger 46 and the first blower 47 sequentially, and then be discharged to the outside of the casing 41 through the first opening 42. The first communicating portion 44 may be formed in the second casing 41*b* to be located above the first opening 42. However, the locations of the first communicating portion 44 and the first opening 42 are not limited to the above example, and the first communicating portion 44 and the first opening 42 may be positioned at any other locations.

The first opening 42 may be formed to correspond to the outlet 15, and the first communicating portion 44 may be formed to correspond to the inlet 14.

The heat-exchange module 40 may further include the first blower 47. The first blower 47 may be disposed in the inside of the casing 41 to be located on the first cooling flow path 70. The first blower 47 may be disposed below the heat exchanger 46. The first blower 47 may communicate with the outlet 15. The first blower 47 may include the first blow case 47*a*, and the first blow fan 47*b* accommodated in the inside of the first blow case 47*a*. The first blow fan 47*b* may generate discharge power so that outside air is discharged to the outside of the casing 41 through the first opening 42. The first blow case 47*a* may be fixed at and coupled with the first casing 41*a*. The first blower 47 may further include a motor to drive the first blow fan 47*b*.

The heat-exchange module 40 may further include the second blower 48. The second blower 48 may be disposed in the inside of the casing 41 to be located on the second cooling flow path 80. The second blower 48 may be disposed above the heat exchanger 46. The second blower 48 may communicate with the second opening 43. The second blower 48 may include the second blow case 48*a*, and the second blow fan 48*b* accommodated in the inside of the second blow case 48*a*, The second blow fan 48*b* may generate discharge power so that air is discharged to the outside of the casing 41 through the second opening 43. The second blow case 48*a* may be fixed at and coupled with the second casing 41*b*. The second blower 48 may further include a motor to drive the second blow fan 48*b*.

Outside air may move along the first cooling flow path 70. Relatively cold outside air may pass through the inlet 14 and the first communicating portion 44 sequentially, and enter the first channel 46*a* of the heat exchanger 46. The outside air moving along the first channel 46*a* may exchange heat with inside air moving along the second channel 46*b*. Through this process, the inside air may be cooled. The outside air that exchanged heat with the inside air may pass through the first opening 42 and the outlet 15 by the discharge power from the first blow fan 47*b*, sequentially, and be discharged to the outside of the outdoor display apparatus 1.

The inside air may move along the second cooling flow path 80. The inside air may be heated by sunlight, the display module 30, the control module 60, etc. Accordingly, the inside air may be relatively warm. The inside air may pass through the second communicating portion 45 to enter the second channel 46*b* of the heat exchanger 46. While the inside air moves along the second channel 46*b*, the inside air may exchange heat with outside air moving along the first channel 46*a*. At this time, the inside air may lose heat by transferring the heat to the outside air and become cooler than before. Then, the inside air may pass through the second opening 43, and then be discharged toward the display module 30. The inside air discharged to the outside of the heat-exchange module 40 may circulate along the circumference of the display module 30.

Figure 10:
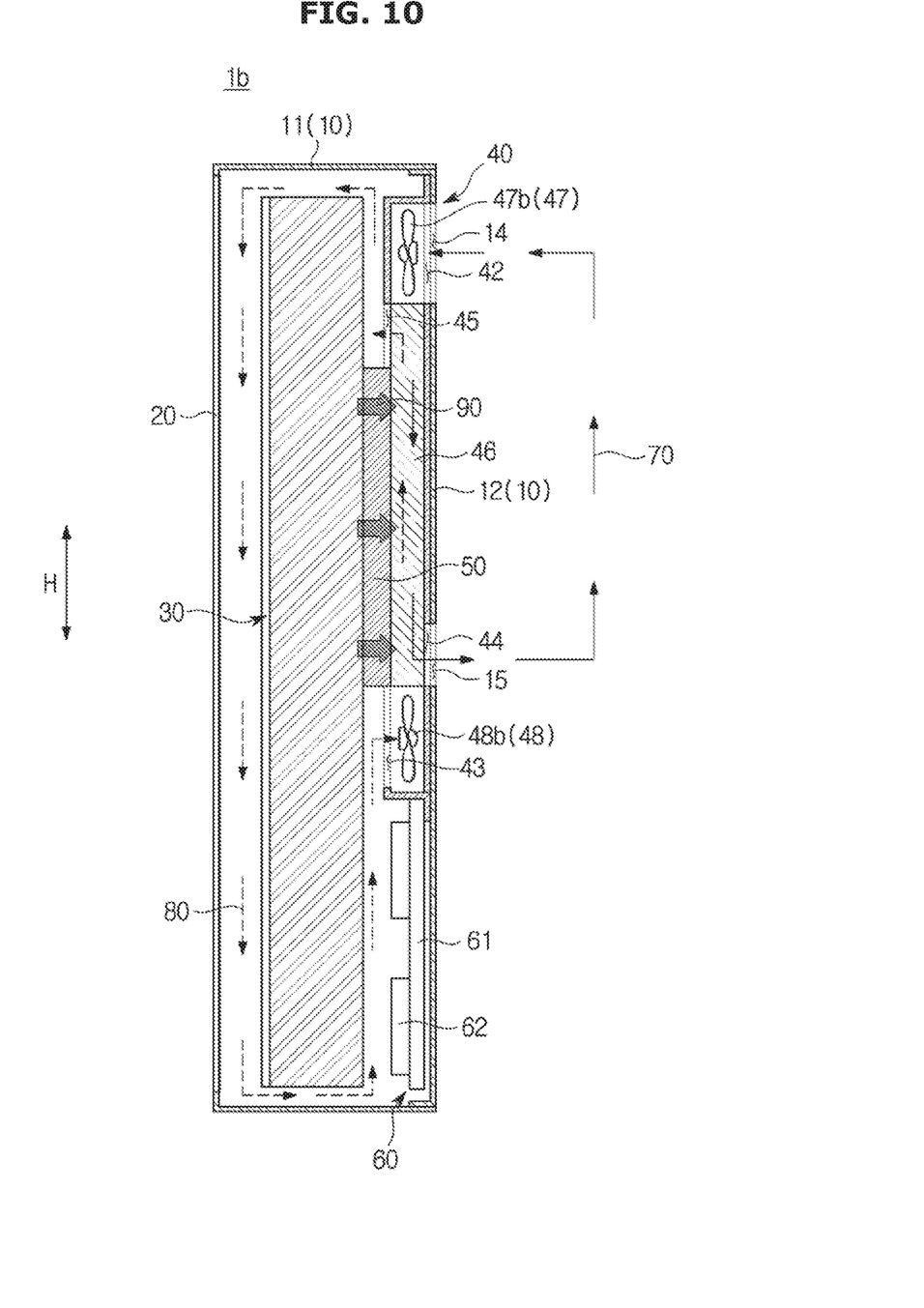
FIG. 10 is a cross-sectional view of an outdoor display apparatus according to still another exemplary embodiment.

FIG. 10 is a cross-sectional view of an outdoor display apparatus according to still another exemplary embodiment. Hereinafter, descriptions overlapping with those described above with reference to FIGS. 1 to 8 will be omitted. A reference numeral "1*b*" indicates the outdoor display apparatus.

As shown in FIG. 10, the heat-exchange module 40 may directly contact the rear surface of the display module 30.

That is, in this case, a separate member such as the heat-transfer member 50 described above may be omitted.

As described above, by disposing the display module 30 and the heat-exchange module 40 such that heat generated from the display module 30 can be transferred to the heat-exchange module 40 by a heat conduction method, it is possible to effectively prevent deterioration of the liquid crystal panel.

If the display module 30 and the heat-exchange module 40 are disposed such that heat generated from the display module 30 can be transferred to the heat-exchange module 40 by the heat conduction method, it is possible to sufficiently prevent deterioration of the liquid panel due to sunlight even when the protective glass is applied without including any infrared reflecting layer By disposing the display module 30 and the heat-exchange module 40 such that the heat-exchange module 40 is coupled with the rear surface of the display module 30, and disposing the control module 60 and the heat-exchange module 40 to be aligned in the height direction of the outdoor display apparatus 1a, it is possible to implement a slim outdoor display apparatus 1a.

By applying the heat-radiating structure without including either a fan or an air filter, it is possible to implement a simple heat-radiating structure, while reducing maintenance cost.

Although a few exemplary embodiments have been shown and described, it would be appreciated by those skilled in the art that changes may be made in these exemplary embodiments without departing from the principles and spirit of the inventive concept, the scope of which is defined in the claims and their equivalents.

What is claimed is:

1. An outdoor display apparatus comprising
a housing;
a display module disposed inside the housing, and including a display panel;
a heat-exchange module disposed on a rear surface of the display module, and configured to concentrate heat inside the housing on a rear surface of the display panel and discharge heat out of the housing,
a heat-transfer member disposed between the display module and the heat-exchange module, and contacting the rear surface of the display module and a front surface of a casing of the heat-exchange module such that heat is transferred from the display module to the heat-exchange module by heat conduction through the heat-transfer member;
a protective glass disposed to correspond to a display area of the display panel, and configured to transmit infrared light; and
a control module configured to drive the display module,
wherein the heat-exchange module comprises a heat exchange fin for separating a first cooling flow path that is connected to outside of the housing from a second cooling flow path that forms a closed loop inside the housing,
wherein the heat exchange fin has a corrugated plate structure, and the first cooling flow path and the second cooling flow path are disposed on opposite sides of the corrugated plate structure such that heat is exchanged between the opposite sides of the corrugated plate structure,
wherein the first cooling flow path is configured to allow outside air to flow in a first direction along the corrugated plate structure, and the second cooling flow path is configured to allow inside air to flow in a second direction opposite to the first direction such that the inside air in the second cooling flow path exchanges heat with the outside air in the first cooling flow path of the corrugated plate structure, and
wherein the first direction is an upward direction or a downward direction.

2. The outdoor display apparatus according to claim 1, wherein the heat-transfer member includes at least one of a thermal pad and a metal member.

3. The outdoor display apparatus according to claim 1, wherein the control module is aligned with the heat-exchange module in a height direction of the outdoor display apparatus.

4. The outdoor display apparatus according to claim 1, wherein the casing has a first opening and a second opening, the first opening being located on the first cooling flow path, and the second opening being located on the second cooling flow path.

5. The outdoor display apparatus according to claim 4, wherein the heat-exchange module further comprises:
a first blower disposed inside the casing and located on the first cooling flow path; and
a second blower disposed inside the casing and located on the second cooling flow path.

6. The outdoor display apparatus according to claim 5, wherein the housing has an inlet and an outlet, and
wherein the first blower communicates with one of the inlet and the outlet.

7. The outdoor display apparatus according to claim 5, wherein the second blower communicates with one of the first opening and the second opening.

8. The outdoor display apparatus according to claim 1, wherein the protective glass comprises:
a substrate layer formed of a glass material; and
a reflection preventing layer disposed on the substrate layer.

* * * * *